United States Patent
Fujii et al.

(10) Patent No.: US 7,923,903 B2
(45) Date of Patent: Apr. 12, 2011

(54) INORGANIC FILM BASE PLATE, PROCESS FOR PRODUCING THE SAME, PIEZOELECTRIC DEVICE, INK JET TYPE RECORDING HEAD, AND INK JET TYPE RECORDING APPARATUS

(75) Inventors: Takamichi Fujii, Kanagawa-ken (JP); Hiroyuki Usami, Ebina (JP)

(73) Assignees: Fujifilm Corporation, Tokyo (JP); Fuji Xerox Co., Ltd., Tokyo (JP)

( * ) Notice: Subject to any disclaimer, the term of this patent is extended or adjusted under 35 U.S.C. 154(b) by 546 days.

(21) Appl. No.: 11/586,651

(22) Filed: Oct. 26, 2006

(65) Prior Publication Data

US 2007/0097181 A1  May 3, 2007

(30) Foreign Application Priority Data

Oct. 28, 2005  (JP) ................................ 2005-314261

(51) Int. Cl.
*H01L 41/08* (2006.01)
(52) U.S. Cl. ........................................ 310/331; 310/324
(58) Field of Classification Search .......... 310/330–331, 310/324, 800, 357–5; 347/68–70
See application file for complete search history.

(56) References Cited

U.S. PATENT DOCUMENTS

| | | | | |
|---|---|---|---|---|
| 4,115,789 | A * | 9/1978 | Fischbeck | 347/70 |
| 6,140,746 | A * | 10/2000 | Miyashita et al. | 310/358 |
| 6,315,390 | B1 * | 11/2001 | Fujii et al. | 347/42 |
| 6,327,760 | B1 * | 12/2001 | Yun et al. | 29/25.35 |
| 6,436,838 | B1 | 8/2002 | Ying et al. | |
| 6,543,107 | B1 * | 4/2003 | Miyashita et al. | 29/25.35 |
| 6,584,708 | B2 * | 7/2003 | Yun et al. | 310/324 |
| 6,619,785 | B1 * | 9/2003 | Sato | 347/50 |
| 6,843,554 | B2 * | 1/2005 | Nagata et al. | 347/68 |
| 6,971,738 | B2 * | 12/2005 | Sugahara | 347/71 |
| 7,183,694 | B2 * | 2/2007 | Nanataki et al. | 310/324 |
| 7,221,075 | B2 * | 5/2007 | Nanataki et al. | 310/324 |
| 7,513,041 | B2 * | 4/2009 | Ito et al. | 29/890.1 |

FOREIGN PATENT DOCUMENTS

JP    2005-153353 A    6/2005

* cited by examiner

*Primary Examiner* — Mark Budd
(74) *Attorney, Agent, or Firm* — Birch, Stewart, Kolasch & Birch, LLP (57) ABSTRACT

An inorganic film base plate is produced with a process comprising the steps of: preparing a surface recess-protrusion base plate, which is provided with a recess-protrusion pattern on a surface, and forming an inorganic film along a surface shape of the surface recess-protrusion base plate, the inorganic film containing a plurality of pillar-shaped structure bodies, each of which extends in a direction nonparallel with the base plate surface of the surface recess-protrusion base plate. Force of physical action may then be exerted upon the thus formed inorganic film in order to separate an on-protrusion film region of the inorganic film and an adjacent on-recess film region of the inorganic film from each other.

13 Claims, 5 Drawing Sheets

- PIEZOELECTRIC FILM
- θ1 TAPER FACE
- SURFACE RECESS-PROTRUSION BASE PLATE

INORGANIC FILM BASE PLATE, PROCESS FOR PRODUCING THE SAME, PIEZOELECTRIC DEVICE, INK JET TYPE RECORDING HEAD, AND INK JET TYPE RECORDING APPARATUS

BACKGROUND OF THE INVENTION

1. Field of the Invention

This invention relates to an inorganic film base plate, which comprises a base plate and an inorganic film having been formed on the base plate. This invention also relates to a process for producing the inorganic film base plate. This invention further relates to a piezoelectric device comprising an inorganic film, which contains a piezoelectric material, and electrodes for applying an electric field across the inorganic film, the inorganic film and the electrodes being formed on a base plate. This invention still further relates to an ink jet type recording head and an ink jet type recording apparatus, which are provided with the piezoelectric device.

2. Description of the Related Art

Piezoelectric devices provided with a piezoelectric film, which has piezoelectric characteristics such that the piezoelectric film expands and contracts in accordance with an increase and a decrease in electric field applied across the piezoelectric film, and electrodes for applying the electric field in a predetermined direction across the piezoelectric film have heretofore been used as actuators to be loaded on ink jet type recording heads, and the like. As piezoelectric materials, there have heretofore been known composite oxides having a perovskite structure, such as lead zirconate titanate (PZT).

As described in, for example, Japanese Unexamined Patent Publication No. 2005-153353, it has been reported that the piezoelectric film is not constituted of a continuous film and is constituted of a pattern composed of a plurality of regions (ordinarily, protruding regions), which are mechanically separated from one another, such that the expansion and contraction of the piezoelectric film may occur smoothly and such that a large displacement quantity may be obtained. Each of regions of a piezoelectric film, which regions are mechanically separated from one another and are capable of undergoing independent expansion and contraction, will herein be referred to as the piezoelectric region.

In order for a desired strain displacement quantity to be obtained, the piezoelectric film is formed so as to have a thickness falling within the range of approximately 1 μm to approximately 5 μm. The thickness of the piezoelectric film falling within the aforesaid range is larger than the thickness of each of the electrodes, and the like, on the order of nanometers (e.g., the thickness of 200 nm). As described in, for example, U.S. Pat. No. 6,436,838, heretofore, the piezoelectric films, such as the PZT films, are ordinarily subjected to the patterning with dry etching processing.

Ordinarily, the dry etching processing is known as an isotropic etching processing. However, PZT, or the like, is a material which is hard to etch. Also, the piezoelectric films are thicker than the electrodes, and the like, having a thickness on the order of nanometers. Therefore, the drying etching processing of the piezoelectric films is harder to perform than the processing of the electrodes, and the like. Accordingly, in cases where the dry etching processing is performed on the piezoelectric films, perfectly an isotropic etching is not always capable of being achieved, and end faces of the piezoelectric regions having been formed with the dry etching processing are apt to have taper shapes.

In the cases of the ink jet type recording heads, such that enhanced image quality of recorded images may be obtained, a high level of uniformity in piezoelectric characteristics of the plurality of the piezoelectric regions constituting the piezoelectric films is required of the ink jet type recording heads. However, with the dry etching processing, which yields the piezoelectric regions having the taper end face shapes, it is not always possible to accomplish accurate matching of angles of the end faces of the plurality of the piezoelectric regions. Hereafter, there will be the possibility that the adverse effects of a variation in piezoelectric characteristics, which variation occurs due to a variation in shapes of the piezoelectric regions, upon the image quality of the recorded images will not be capable of being ignored. In cases where the accuracy of the end face shapes of the piezoelectric regions is taken into consideration, the end face shapes of the piezoelectric regions should preferably reliably take shapes approximately normal to a surface of a base plate, on which the piezoelectric regions are formed.

Also, with the piezoelectric films, such as the PZT films, the problems are encountered in that, since the dry etching processing is hard to perform due to the material characteristics and the thicknesses of the piezoelectric films, a long time is required to perform the patterning. Further, with the dry etching processing, since a vacuum process is necessary, the cost is not capable of being kept low.

SUMMARY OF THE INVENTION

The primary object of the present invention is to provide a film separating technique, with which an inorganic film containing a plurality of mechanically separated regions is capable of being formed accurately and with a simple process, regardless of a material and a thickness of the inorganic film, with which a shape accuracy of each of the mechanically separated regions is capable of being kept high, and which is appropriate for formation of a piezoelectric film, or the like.

Another object of the present invention is to provide an inorganic film base plate, which is obtained with the film separating technique.

A further object of the present invention is to provide a piezoelectric device comprising the inorganic film base plate.

A still further object of the present invention is to provide an ink jet type recording head, which is provided with the piezoelectric device.

The present invention provides a first inorganic film base plate, produced with a process comprising the steps of:

i) preparing a surface recess-protrusion base plate, which is provided with a recess-protrusion pattern on a surface, and ii) forming an inorganic film along a surface shape of the surface recess-protrusion base plate, the inorganic film containing a plurality of pillar-shaped structure bodies, each of which extends in a direction nonparallel with the base plate surface of the surface recess-protrusion base plate.

The term "base plate surface of a surface recess-protrusion base plate" as used herein means the surface of the flat area (the top surface of each of protruding areas constituting the recess-protrusion pattern or the bottom surface of each of recess areas constituting the recess-protrusion pattern) of the surface recess-protrusion base plate on the side on which the recess-protrusion pattern has been formed.

The inorganic film of the first inorganic film base plate in accordance with the present invention, which inorganic film contains the plurality of the pillar-shaped structure bodies, may have a crystalline structure. Alternatively, the inorganic film may have an amorphous structure. However, the inorganic film should preferably have the crystalline structure.

The pillar-shaped structure bodies, which are adjacent to each other, are apt to be mechanically separated easily from each other. Therefore, with the first inorganic film base plate in accordance with the present invention, basically, in cases where the inorganic film, which contains the plurality of the pillar-shaped structure bodies, is merely formed on the surface recess-protrusion base plate, an on-protrusion film region of the inorganic film, which on-protrusion film region is located on each of protruding areas constituting the recess-protrusion pattern of the surface recess-protrusion base plate, and an adjacent on-recess film region of the inorganic film, which on-recess film region is located on each of recess areas constituting the recess-protrusion pattern of the surface recess-protrusion base plate, are capable of being mechanically separated from each other.

As described above, the pillar-shaped structure bodies, which are adjacent to each other, are apt to be mechanically separated easily from each other. However, the mechanical separation is capable of occurring only when a separation starting point exists. With the first inorganic film base plate in accordance with the present invention, the base plate on which the inorganic film is to be formed is constituted of the surface recess-protrusion base plate. Therefore, a boundary part between the protruding area of the base plate surface and the recess area, which is adjacent to the protruding area, is capable of acting as the separation starting point, and the on-protrusion film region of the inorganic film and the adjacent on-recess film region of the inorganic film are capable of being mechanically separated appropriately from each other.

Figure 6:
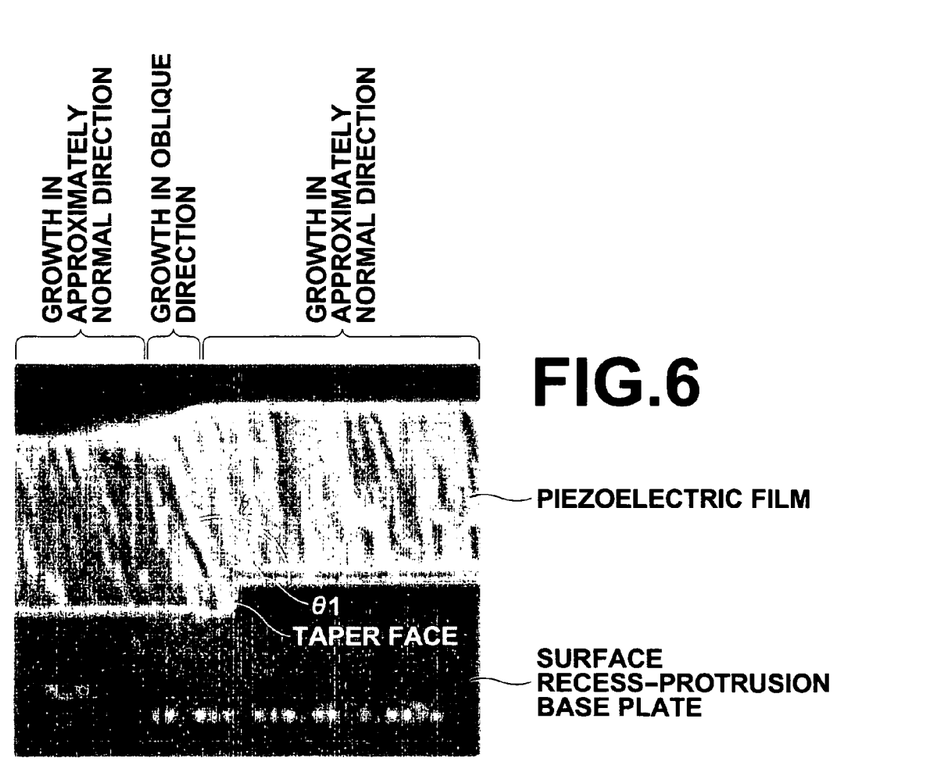
FIG. 6 is a diagram showing an SEM sectional photograph of a piezoelectric device (an inorganic film base plate) obtained in Example 1.

Each of the pillar-shaped structure bodies primarily has the properties such that the pillar-shaped structure body grows in the direction approximately normal to a support surface. For example, in cases where the side face of each of the protruding areas constituting the recess-protrusion pattern of the surface recess-protrusion base plate has at a per slant, the direction of the growth of the pillar-shaped structure body varies between the top flat surface and the slant side face of the protruding area constituting the recess-protrusion pattern. At the boundary between the adjacent areas, in which the directions of the growth of the pillar-shaped structure bodies vary from each other, the adjacent pillar-shaped structure bodies having grown come into collision with each other. Therefore, at the boundary described above, the binding of the adjacent pillar-shaped structure bodies with each other is weak, and the adjacent pillar-shaped structure bodies are apt to be mechanically separated easily from each other (as will be described later in Example 1 and with reference to FIG. 6 showing an SEM sectional photograph).

Also, in cases where the side face of each of the protruding areas constituting the recess-protrusion pattern of the surface recess-protrusion base plate is normal to the base plate surface, the growth of the pillar-shaped structure body on the protruding area constituting the recess-protrusion pattern and the growth of the pillar-shaped structure body on the adjacent recess area constituting the recess-protrusion pattern occur such that the adjacent pillar-shaped structure bodies having grown may come into collision with each other at the boundary between the protruding area and the recess area constituting the recess-protrusion pattern. Therefore, at the boundary described above, the binding of the adjacent pillar-shaped structure bodies with each other is weak, and the adjacent pillar-shaped structure bodies are apt to be mechanically separated easily from each other.

However, it may often occur that, merely with the formation of the aforesaid inorganic film on the surface recess-protrusion base plate, each of the on-protrusion film regions of the inorganic film and the adjacent on-recess film region of the inorganic film are not mechanically separated from each other. In such cases, slight force of physical action (such as ultrasonic vibration, or expansion and contraction by application of an electric field in the cases of piezoelectric materials) may be applied to the inorganic film, and each of the on-protrusion film regions of the inorganic film and the adjacent on-recess film region of the inorganic film are thus capable of being mechanically separated easily from each other.

The present invention also provides a second inorganic film base plate, produced with a process comprising the steps of:

i) preparing a surface recess-protrusion base plate, which is provided with a recess-protrusion pattern on a surface, ii) forming an inorganic film along a surface shape of the surface recess-protrusion base plate, the inorganic film containing a plurality of pillar-shaped structure bodies, each of which extends in a direction nonparallel with the base plate surface of the surface recess-protrusion base plate, and iii) exerting force of physical action upon the thus formed inorganic film, whereby an on-protrusion film region of the inorganic film, which on-protrusion film region is located on each of protruding areas constituting the recess-protrusion pattern of the surface recess-protrusion base plate, and an adjacent on-recess film region of the inorganic film, which on-recess film region is located on each of recess areas constituting the recess-protrusion pattern of the surface recess-protrusion base plate, are mechanically separated from each other.

Each of the first and second inorganic film base plates in accordance with the present invention may be modified such that the inorganic film has a structure, such that the on-protrusion film region of the inorganic film and the adjacent on-recess film region of the inorganic film are separated from each other at an interface between the pillar-shaped structure bodies.

Also, each of the first and second inorganic film base plates in accordance with the present invention should preferably be modified such that a boundary surface between the on-protrusion film region of the inorganic film and the adjacent on-recess film region of the inorganic film makes an angle falling within the range of 90±45° with respect to the base plate surface of the surface recess-protrusion base plate.

Further, each of the first and second inorganic film base plates in accordance with the present invention should preferably be modified such that a difference in surface height between each of the recess areas of the recess-protrusion pattern of the surface recess-protrusion base plate and each of the protruding areas of the recess-protrusion pattern is equal to at least 1/30 of a thickness of the inorganic film.

Furthermore, each of the first and second inorganic film base plates in accordance with the present invention should preferably be modified such that a difference in surface height between each of the recess areas of the recess-protrusion pattern of the surface recess-protrusion base plate and each of the protruding areas of the recess-protrusion pattern falls within the range of 0.1 µm to 2 µm.

Also, each of the first and second inorganic film base plates in accordance with the present invention should preferably be modified such that a side face of each of the protruding areas constituting the recess-protrusion pattern of the surface recess-protrusion base plate makes an angle falling within the range of 5° to 135° with respect to the base plate surface of the surface recess-protrusion base plate.

Each of the term "angle of a side face of each of protruding areas constituting a recess-protrusion pattern of a surface recess-protrusion base plate with respect to a base plate surface of a surface recess-protrusion base plate" as used herein and the term "angle of a boundary surface between an on-protrusion film region of an inorganic film and an adjacent on-recess film region of the inorganic film with respect to a base plate surface of a surface recess-protrusion base plate" as used herein is defined as the angle, which is formed in cases where the top surface of each of the protruding areas of the surface recess-protrusion base plate is taken as the reference surface, and in cases where the direction heading from the reference surface, through the region within the inorganic film, toward the bottom surface of the adjacent recess area of the surface recess-protrusion base plate is taken as the "+" direction. In the example illustrated in FIG. 6, the angle of the side face of each of the protruding areas constituting the recess-protrusion pattern of the surface recess-protrusion base plate, which angle is made with respect to the base plate surface of the surface recess-protrusion base plate, is represented by θ1. Also, the angle of the boundary surface between the on-protrusion film region of the inorganic film and the adjacent on-recess film region of the inorganic film, which angle is made with respect to the base plate surface of the surface recess-protrusion base plate, is represented by θ2.

Further, each of the first and second inorganic film base plates in accordance with the present invention should preferably be modified such that a mean pillar diameter of the plurality of the pillar-shaped structure bodies constituting the inorganic film falls within the range of 30 μm to 1 μm.

Each of the first and second inorganic film base plates in accordance with the present invention is efficient in cases where, for example, the inorganic film is constituted of a ferroelectric substance. Each of the first and second inorganic film base plates in accordance with the present invention is efficient particularly in cases where, for example, the inorganic film is constituted of a piezoelectric material.

The present invention further provides a piezoelectric device, which is provided with the first or second inorganic film base plate in accordance with the present invention, and in which the inorganic film is constituted of a piezoelectric material, the piezoelectric device comprising:

i) the surface recess-protrusion base plate, ii) the inorganic film, which is constituted of a piezoelectric material, and which is formed on the surface recess-protrusion base plate, and iii) electrodes, which are formed on the surface recess-protrusion base plate, the electrodes applying an electric field across an on-protrusion film region of the inorganic film, which on-protrusion film region is located on each of protruding areas constituting the recess-protrusion pattern of the surface recess-protrusion base plate, and/or across an on-recess film region of the inorganic film, which on-recess film region is located on each of recess areas constituting the recess-protrusion pattern of the surface recess-protrusion base plate.

The present invention still further provides an ink jet type recording head, comprising the piezoelectric device in accordance with the present invention.

The present invention also provides an ink jet type recording apparatus, comprising the piezoelectric device in accordance with the present invention.

The present invention further provides a process for producing an inorganic film base plate, comprising:

i) a step (A) of preparing a surface recess-protrusion base plate, which is provided with a recess-protrusion pattern on a surface, and ii) a step (B) of forming an inorganic film along a surface shape of the surface recess-protrusion base plate, the inorganic film containing a plurality of pillar-shaped structure bodies, each of which extends in a direction nonparallel with the base plate surface of the surface recess-protrusion base plate.

The process for producing an inorganic film base plate in accordance with the present invention may be modified such that the process further comprises a step (C) of exerting force of physical action upon the inorganic film, whereby an on-protrusion film region of the inorganic film, which on-protrusion film region is located on each of protruding areas constituting the recess-protrusion pattern of the surface recess-protrusion base plate, and an adjacent on-recess film region of the inorganic film, which on-recess film region is located on each of recess areas constituting the recess-protrusion pattern of the surface recess-protrusion base plate, are mechanically separated from each other.

The inorganic film base plate in accordance with the present invention is produced with the process comprising the steps of: (i) preparing the surface recess-protrusion base plate, which is provided with the recess-protrusion pattern on the surface, and (ii) forming the inorganic film along the surface shape of the surface recess-protrusion base plate, the inorganic film containing the plurality of the pillar-shaped structure bodies, each of which extends in the direction nonparallel with the base plate surface of the surface recess-protrusion base plate.

The pillar-shaped structure bodies, which are adjacent to each other, are apt to be mechanically separated easily from each other. Therefore, with the inorganic film base plate in accordance with the present invention, the inorganic film having the structure, such that the on-protrusion film region of the inorganic film, which on-protrusion film region is located on each of the protruding areas constituting the recess-protrusion pattern of the surface recess-protrusion base plate, and the adjacent on-recess film region of the inorganic film, which on-recess film region is located on each of the recess areas constituting the recess-protrusion pattern of the surface recess-protrusion base plate, are mechanically separated from each other, is capable of being obtained at a high accuracy, with the simple process free from an etching step, and at a low cost regardless of the material and the thickness of the inorganic film.

As described above, the pillar-shaped structure bodies, which are adjacent to each other, are apt to be mechanically separated easily from each other. However, the mechanical separation is capable of occurring only when a separation starting point exists. With the inorganic film base plate in accordance with the present invention, the base plate on which the inorganic film is to be formed is constituted of the surface recess-protrusion base plate. Therefore, the boundary part between the protruding area of the base plate surface and the recess area, which is adjacent to the protruding area, is capable of acting as the separation starting point, and the on-protrusion film region of the inorganic film and the adjacent on-recess film region of the inorganic film are capable of being mechanically separated appropriately from each other.

With the inorganic film base plate in accordance with the present invention, the on-protrusion film region of the inorganic film and the adjacent on-recess film region of the inorganic film are capable of being separated appropriately from each other at the interface between the pillar-shaped structure bodies. Therefore, the surface direction of the boundary surface between the on-protrusion film region of the inorganic film and the adjacent on-recess film region of the inorganic film is capable of approximately coinciding with the direction of orientation of the pillar-shaped structure body, which is located at the boundary part between the on-protrusion film region of the inorganic film and the adjacent on-recess film region of the inorganic film. Accordingly, a variation of the angle of the boundary surface between the on-protrusion film region of the inorganic film and the adjacent on-recess film region of the inorganic film is capable of being suppressed markedly. Also, the smoothness of the boundary surface between the on-protrusion film region of the inorganic film and the adjacent on-recess film region of the inorganic film is capable of being kept good.

With the inorganic film base plate in accordance with the present invention, the angle of the side face of each of the protruding areas constituting the recess-protrusion pattern of the surface recess-protrusion base plate may be set to be approximately normal to the base plate surface of the surface recess-protrusion base plate, and the pillar-shaped structure bodies may thus be orientated in the direction approximately normal to the base plate surface of the surface recess-protrusion base plate. In such cases, the angle of the boundary surface between the on-protrusion film region of the inorganic film and the adjacent on-recess film region of the inorganic film, which angle is made with respect to the base plate surface of the surface recess-protrusion base plate, is capable of being reliably set to be approximately normal to the base plate surface of the surface recess-protrusion base plate.

As described above, with the inorganic film base plate in accordance with the present invention, the inorganic film containing the plurality of the mechanically separated regions is capable of being formed accurately and with the simple process, regardless of the material and the thickness of the inorganic film. Also, the shape accuracy of each of the mechanically separated regions is capable of being kept high.

DESCRIPTION OF THE PREFERRED EMBODIMENTS

The present invention will hereinbelow be described in further detail with reference to the accompanying drawings.

[Piezoelectric Device and Ink Jet Type Recording Head]

Figure 1:
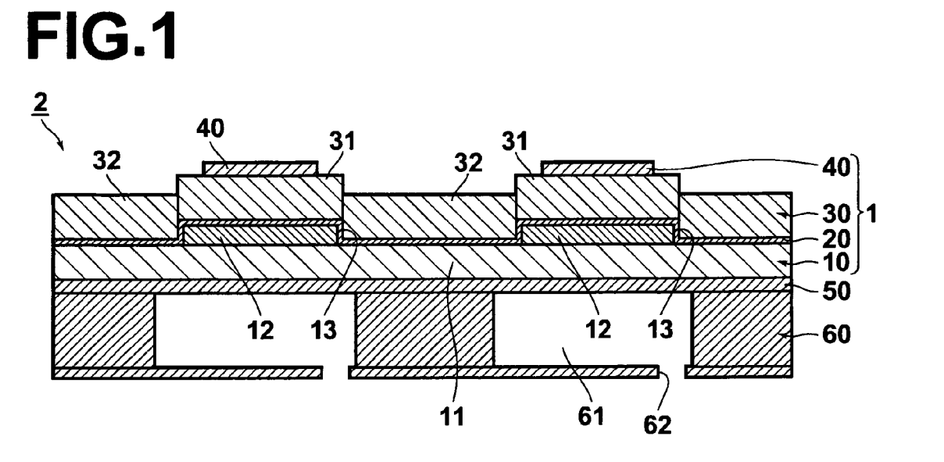
FIG. 1 is a sectional view showing an embodiment of the piezoelectric device in accordance with the present invention and an ink jet type recording head comprising the piezoelectric device.

An embodiment of the piezoelectric device (acting as the inorganic film base plate) in accordance with the present invention and an ink jet type recording head comprising the piezoelectric device will be described hereinbelow with reference to FIG. 1. FIG. 1 is a sectional view showing a major part of the ink jet type recording head, the view being taken in the thickness direction of the piezoelectric device. In FIG. 1, for clearness, reduced scales of constituent elements of the ink jet type recording head are varied from actual reduced scales.

With reference to FIG. 1, a piezoelectric device (acting as the inorganic film base plate) 1, which is an embodiment of the piezoelectric device in accordance with the present invention, comprises a surface recess-protrusion base plate 10, which is provided with a recess-protrusion pattern having been formed on a surface. The piezoelectric device 1 also comprises a bottom electrode 20, a piezoelectric film (acting as the inorganic film) 30, and a plurality of top electrodes 40, 40, . . . , which are laminated in this order on the surface recess-protrusion base plate 10. The piezoelectric film 30 is constituted of an inorganic compound having the piezoelectric characteristics. An electric field is applied across the piezoelectric film 30 in the thickness direction of the piezoelectric film 30 by the bottom electrode 20 and each of the top electrodes 40, 40, . . . .

The surface recess-protrusion base plate 10 comprises a flat base plate 11, which may be constituted of a silicon base plate, or the like. The surface recess-protrusion base plate 10 also comprises a plurality of line-like protruding areas 12, 12, . . . , which have been formed in a striped pattern on the flat base plate 11. Each of the areas of the surface of the surface recess-protrusion base plate 10, which areas are free from the protruding areas 12, 12, . . . , constitutes one of recess areas 13, 13, . . . . The width of each of the protruding areas 12, 12, . . . and the width of each of the recess areas 13, 13, . . . may be identical with each other or different from each other. The width of each of the protruding areas 12, 12, . . . and the width of each of the recess areas 13, 13, . . . may be designed arbitrarily.

The bottom electrode 20 and the piezoelectric film 30 are laminated in this order over the approximately entire area of the surface of the surface recess-protrusion base plate 10 and along the surface shape of the surface recess-protrusion base plate 10.

The piezoelectric film 30 is constituted of a plurality of on-protrusion film regions 31, 31, . . . , each of which is located on one of the protruding areas 12, 12, . . . of the surface recess-protrusion base plate 10, and a plurality of on-recess film regions 32, 32, . . . , each of which is located on one of the recess areas 13, 13, . . . of the surface recess-protrusion base plate 10. Each of the on-protrusion film regions 31, 31, . . . and the adjacent one of the on-recess film regions 32, 32, . . . have been mechanically separated from each other. In this embodiment, each of the top electrodes 40, 40, . . . is formed on one of the on-protrusion film regions 31, 31, . . . of the piezoelectric film 30. Each of the on-protrusion film regions 31, 31, . . . acts as the piezoelectric region, which undergoes the expansion and contraction in accordance with an alteration of the electric field applied across the piezoelectric region.

No limitation is imposed upon the difference in surface height between each of the recess areas 13, 13, . . . of the surface recess-protrusion base plate 10 and each of the protruding areas 12, 12, . . . of the surface recess-protrusion base plate 10 (which difference corresponds to the height of each of the protruding areas 12, 12, . . . ). However, the difference in surface height between each of the recess areas 13, 13, . . . and each of the protruding areas 12, 12, . . . should preferably be equal to at least 1/30 of the thickness of the piezoelectric film 30, and should particularly preferably be equal to at least 1/20 of the thickness of the piezoelectric film 30. In cases where the difference in surface height between each of the recess areas 13, 13, . . . and each of the protruding areas 12, 12, . . . is set to be equal to at least 1/30 of the thickness of the piezoelectric film 30, each of the on-protrusion film regions 31, 31, . . . and the adjacent one of the on-recess film regions 32, 32, . . . are capable of being mechanically separated appropriately from each other.

In cases where the piezoelectric film 30 has a comparatively large thickness falling within the range of approximately 2 µm to approximately 10 µm, the difference in surface height between each of the recess areas 13, 13, . . . of the surface recess-protrusion base plate 10 and each of the protruding areas 12, 12, . . . of the surface recess-protrusion base plate 10 should preferably fall within the range of 0.1 µm to 2 µm. In such cases, each of the on-protrusion film regions 31, 31, . . . and the adjacent one of the on-recess film regions 32, 32, . . . are capable of being mechanically separated appropriately from each other.

FIG. 1 shows the cases wherein the side face of each of the protruding areas 12, 12, . . . of the surface recess-protrusion base plate 10 is normal with respect to the base plate surface of the surface recess-protrusion base plate 10. Alternatively, the side face of each of the protruding areas 12, 12, . . . may have a taper slant. Such that each of the on-protrusion film regions 31, 31, . . . and the adjacent one of the on-recess film regions 32, 32, . . . are capable of being mechanically separated appropriately from each other, the angle θ1 of the side face of each of the protruding areas 12, 12, . . . with respect to the base plate surface should preferably fall within the range of 5° to 135°.

In cases where the side face of each of the protruding areas 12, 12, . . . has a shape falling within the range of a regular taper slant to a shape normal to the base plate surface of the surface recess-protrusion base plate 10 (i.e., θ1≦90°) (the SEM sectional photograph of a piezoelectric device of Example 1 illustrated in FIG. 6 shows an example in which the side face of each of the protruding areas 12, 12, . . . has a regular taper slant), the angle θ1 should preferably fall within the range of 45° to 850°, should more preferably fall within the range of 60° to 80°, and should particularly preferably fall within the range of 70° to 80°.

In cases where the side face of each of the protruding areas 12, 12, . . . has a shape falling within the range of a reverse taper slant to a shape normal to the base plate surface of the surface recess-protrusion base plate 10 (i.e., θ1≧90°), the angle θ1 should preferably fall within the range of 95° to 135°, should more preferably fall within the range of 100° to 120°, and should particularly preferably fall within the range of 100° to 110°.

No limitation is imposed upon a material of the flat base plate 11. Examples of the materials of the flat base plate 11 includes silicon, glass, stainless steel, yttrium stabilized zirconia (YSZ), alumina, sapphire, and silicon carbide. Also, no limitation is imposed upon a material of the protruding areas 12, 12, . . . , which are formed on the flat base plate 11. Examples of the materials of the protruding areas 12, 12, . . . include $SiO_2$, AlN, SiN, SiC, and combinations of the above-enumerated materials.

No limitation is imposed upon a material of the bottom electrode 20. Examples of the materials of the bottom electrode 20 include metals, such as Pt and Ir; metal oxides, such as $IrO_2$, $RuO_2$, $LaNiO_3$, and $SrRuO_3$; and combinations of the above-enumerated metals and/or the above-enumerated metal oxides. Also, no limitation is imposed upon a material of the top electrodes 40, 40, . . . . Examples of the materials of the top electrodes 40, 40, . . . include the materials exemplified above for the bottom electrode 20; electrode materials ordinarily utilized in semiconductor processes, such as Al, Ta, Cr, and Cu; and combinations of the materials exemplified above for the bottom electrode 20 and/or the above-enumerated electrode materials.

No limitation is imposed upon a material of the piezoelectric film 30. However, the material of the piezoelectric film 30 should preferably be selected from composite oxides having a perovskite structure, which composite oxides may contain inevitable impurities. Examples of the composite oxides having the perovskite structure include lead-containing compounds, such as lead zirconate titanate (PZT), lead zirconate, lead lanthanum titanate, lead lanthanum zirconate titanate, magnesium niobate lead zirconate titanate, and nickel niobate lead zirconate titanate; lead-free compounds, such as barium titanate, sodium niobate, and bismuth titanate; and combinations of the above-enumerated compounds. The above-enumerated piezoelectric materials are ferroelectric substances having spontaneous polarization characteristics at the time free from electric field application.

No limitation is imposed upon the thickness of the piezoelectric film 30. The thickness of the piezoelectric film 30 may ordinarily be at least 1 µm and may fall within the range of, for example, 1 µm to 5 µm. The thickness of the piezoelectric film 30 is larger than the thickness of each of the bottom electrode 20 and the top electrodes 40, 40, . . . on the order of nanometers (e.g., 200 nm).

In this embodiment, the piezoelectric film 30 is constituted of a crystalline inorganic film containing a plurality of pillar-shaped structure bodies, each of which extends in a direction nonparallel with the base plate surface of the surface recess-protrusion base plate 10. Each of the on-protrusion film regions 31, 31, . . . of the piezoelectric film 30 and the adjacent one of the on-recess film regions 32, 32, . . . of the piezoelectric film 30 have been separated from each other at the interface between the pillar-shaped structure bodies. (Reference may be made to the SEM sectional photograph of the piezoelectric device (the inorganic film base plate) obtained in Example 1, which photograph is illustrated in FIG. 6.)

The piezoelectric film 30 should preferably have a crystalline structure. In such cases, the piezoelectric film 30 containing the pillar-shaped structure bodies is capable of being formed easily. Alternatively, the piezoelectric film 30 may have an amorphous structure, such that the piezoelectric film 30 containing the plurality of the pillar-shaped structure bodies is capable of being formed.

As described above, the pillar-shaped structure bodies, which are adjacent to each other, are apt to be mechanically separated easily from each other. Therefore, basically, in cases where the piezoelectric film 30, which contains the plurality of the pillar-shaped structure bodies, is merely formed on the surface recess-protrusion base plate 10, each of the on-protrusion film regions 31, 31, . . . of the piezoelectric film 30 and the adjacent one of the on-recess film regions 32, 32, . . . of the piezoelectric film 30 are capable of being mechanically separated from each other.

As described above, the pillar-shaped structure bodies, which are adjacent to each other, are apt to be mechanically separated easily from each other. However, the mechanical separation is capable of occurring only when a separation starting point exists. With this embodiment, the base plate on which the piezoelectric film 30 is to be formed is constituted of the surface recess-protrusion base plate 10. Therefore, a boundary part between each of the protruding areas 12, 12, . . . on the surface of the surface recess-protrusion base plate 10 and the adjacent one of the recess areas 13, 13, . . . on the surface of the surface recess-protrusion base plate 10 is capable of acting as the separation starting point, and each of the on-protrusion film regions 31, 31, . . . of the piezoelectric film 30 and the adjacent one of the on-recess film regions 32, 32, . . . of the piezoelectric film 30 are capable of being mechanically separated appropriately from each other.

However, it may often occur that, merely with the formation of the piezoelectric film 30, which contains the plurality of the pillar-shaped structure bodies, on the surface recess-protrusion base plate 10, each of the on-protrusion film regions 31, 31, ... of the piezoelectric film 30 and the adjacent one of the on-recess film regions 32, 32, ... of the piezoelectric film 30 are not mechanically separated from each other. In such cases, slight force of physical action (such as expansion and contraction by application of an electric field in the cases of piezoelectric materials) may be applied to the piezoelectric film 30, and each of the on-protrusion film regions 31, 31, ... of the piezoelectric film 30 and the adjacent one of the on-recess film regions 32, 32, ... of the piezoelectric film 30 are thus capable of being mechanically separated easily from each other. Besides the application of the electric field, the application of heat, vibrations, or an ultrasonic wave may be performed on the surface recess-protrusion base plate 10 and/or the piezoelectric film 30, and each of the on-protrusion film regions 31, 31, ... of the piezoelectric film 30 and the adjacent one of the on-recess film regions 32, 32, ... of the piezoelectric film 30 are thus capable of being mechanically separated easily from each other.

No limitation is imposed upon the mean pillar diameter of the plurality of the pillar-shaped structure bodies contained in the piezoelectric film 30. However, the mean pillar diameter of the plurality of the pillar-shaped structure bodies should preferably fall within the range of 30 nm to 1 µm. If the mean pillar diameter of the plurality of the pillar-shaped structure bodies is markedly small, there will be the risk that the crystal growth sufficient for the piezoelectric body will not occur, and that the desired piezoelectric performance will not be capable of being obtained. If the mean pillar diameter of the plurality of the pillar-shaped structure bodies is markedly large, there will be the risk that the shape accuracy of the on-protrusion film regions 31, 31, ... and the on-recess film regions 32, 32, ... of the piezoelectric film 30 will become bad.

As for inorganic films containing a plurality of pillar-shaped structure bodies, research has heretofore been conducted on a relationship between film forming conditions (a base plate temperature and a film forming pressure) and shapes or pillar diameters of pillar-shaped structure bodies, and on classification of pillar-shaped structure bodies.

The aforesaid research with respect to vacuum deposited films is described in detail in, for example, a report of Movchan and Demchishin, Phys. Met. Mettallogr., 28, 83 (1969). In cases where the piezoelectric film 30 is a vacuum deposited film, the pillar-shaped structure bodies contained in the piezoelectric film 30 should preferably be of Zone 2 in accordance with the classification described in the aforesaid report.

Also, the aforesaid research with respect to sputtering films is described in detail in, for example, a report of Thornton, J. Vac. Sci. Technol., 11, 666 (1974). In cases where the piezoelectric film 30 is a sputtering film, the pillar-shaped structure bodies contained in the piezoelectric film 30 should preferably be of Zone T to Zone II in accordance with the classification described in the aforesaid report.

Each of the pillar-shaped structure bodies has the properties such that the pillar-shaped structure body grows in the direction approximately normal to a support surface. Therefore, in cases where the side face of each of the protruding areas 12, 12, ... of the surface recess-protrusion base plate 10 is approximately normal to the base plate surface, as illustrated in FIG. 1, theoretically, the boundary surface between each of the on-protrusion film regions 31, 31, ... of the piezoelectric film 30 and the adjacent one of the on-recess film regions 32, 32, ... of the piezoelectric film 30 extends in the direction approximately normal to the base plate surface of the surface recess-protrusion base plate 10. However, at the position in the vicinity of the boundary between each of the protruding areas 12, 12, ... of the surface recess-protrusion base plate 10 and the adjacent one of the recess areas 13, 13, ... of the surface recess-protrusion base plate 10, since the support surface for the pillar-shaped structure bodies contains the step-like part, it may often occur that the direction of the growth of each of the pillar-shaped structure bodies becomes oblique with respect to the support surface. In such cases, even though the side face of each of the protruding areas 12, 12, ... of the surface recess-protrusion base plate 10 is approximately normal to the base plate surface, the boundary surface between each of the on-protrusion film regions 31, 31, ... of the piezoelectric film 30 and the adjacent one of the on-recess film regions 32, 32, ... of the piezoelectric film 30 extends in the direction oblique with respect to the base plate surface of the surface recess-protrusion base plate 10.

Also, in cases where the side face of each of the protruding areas 12, 12, ... of the surface recess-protrusion base plate 10 has a taper slant, as will be described later in Example 1 and illustrated in FIG. 6, the direction of the crystal growth on the side face of each of the protruding areas 12, 12, ... becomes oblique with respect to the base plate surface of the surface recess-protrusion base plate 10, and the boundary surface between each of the on-protrusion film regions 31, 31, ... of the piezoelectric film 30 and the adjacent one of the on-recess film regions 32, 32, ... of the piezoelectric film 30 extends in the direction oblique with respect to the base plate surface of the surface recess-protrusion base plate 10.

No limitation is imposed upon the angle $\theta 2$ of the boundary surface between each of the on-protrusion film regions 31, 31, ... of the piezoelectric film 30 and the adjacent one of the on-recess film regions 32, 32, ... of the piezoelectric film 30, which angle is made with respect to the base plate surface of the surface recess-protrusion base plate 10. In cases where the shape accuracy of the on-protrusion film regions 31, 31, ... and the on-recess film regions 32, 32, ... of the piezoelectric film 30 is taken into consideration, the angle $\theta 2$ of the boundary surface between each of the on-protrusion film regions 31, 31, ... of the piezoelectric film 30 and the adjacent one of the on-recess film regions 32, 32, ... of the piezoelectric film 30, which angle is made with respect to the base plate surface of the surface recess-protrusion base plate 10, should preferably fall within the range of 90±45°, should more preferably fall within the range of 90±30°, and should particularly preferably fall within the range of 90±10°. As will be described later in detail, with this embodiment, the angle $\theta 2$ of the boundary surface between each of the on-protrusion film regions 31, 31, ... of the piezoelectric film 30 and the adjacent one of the on-recess film regions 32, 32, ... of the piezoelectric film 30, which angle is made with respect to the base plate surface of the surface recess-protrusion base plate 10, is capable of being reliably set so as to fall within the range described above.

An ink jet type recording head 2 approximately has a constitution, in which a vibrating plate 50 is secured to the bottom surface of the surface recess-protrusion base plate 10 of the piezoelectric device 1 having been constituted in the manner described above, and in which an ink storing and discharging member 60 is secured to the bottom surface of the vibrating plate 50. The ink storing and discharging member 60 is provided with a plurality of ink chambers 61, 61, ... , in which ink compositions are to be stored, and ink discharge openings 62, 62, ... . The plurality of the ink chambers 61, 61, ... are formed in accordance with the number and the pattern of the on-protrusion film regions 31, 31, ... of the piezoelectric film 30.

The ink jet type recording head 2 is constituted such that each of the on-protrusion film regions 31, 31, . . . of the piezoelectric device 1 is expanded or contracted through alteration of the electric field applied across each of the on-protrusion film regions 31, 31, . . . , and such that the discharge of the ink composition from the corresponding ink chamber 61 and the quantity of the ink composition discharged from the corresponding ink chamber 61 are thereby controlled.

This embodiment of the piezoelectric device 1 and the ink jet type recording head 2 are constituted in the manner described above.

[Production Process]

A process for producing the piezoelectric device 1 and the ink jet type recording head 2 will be described herein below with reference to FIGS. 2A to 2E. FIGS. 2A to 2E are sectional views showing a process for producing the embodiment of the piezoelectric device of FIG. 1.

(Step (A))

Figure 2A:
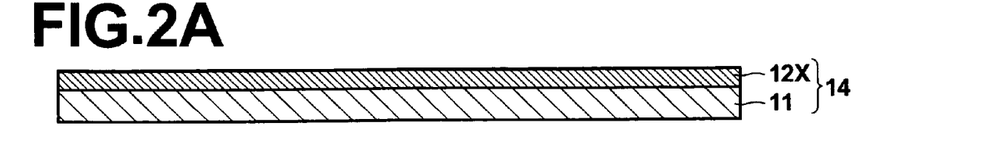
FIGS. 2A to 2E are sectional views showing a process for producing the embodiment of the piezoelectric device of FIG. 1.

Firstly, as illustrated in FIG. 2A, a laminate base plate 14 is prepared. The laminate base plate 14 comprises the flat base plate 11 and a solid film 12X, which is constituted of the material for the formation of the protruding areas 12, 12, . . . and has been formed over approximately the entire area of the surface of the flat base plate 11. The laminate base plate 14 may be produced with a technique, in which the film of the material for the formation of the protruding areas 12, 12, . . . is formed on the flat base plate 11. Alternatively, a commercially available base plate, such as an SOI base plate comprising a silicon base plate and an $SiO_2$ oxide film having been formed on the surface of the silicon base plate, may be utilized.

Figure 2B:
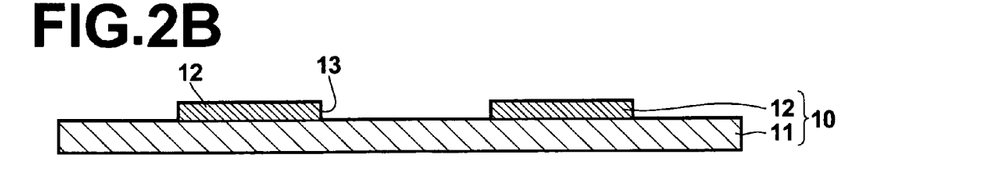

Thereafter, as illustrated in FIG. 2B, patterning processing is performed on the solid film 12X by use of a known technique, and the protruding areas 12, 12, . . . are formed on the flat base plate 11. In this manner, the surface recess-protrusion base plate 10, which is provided with the protruding areas 12, 12, . . . and the recess areas 13, 13, . . . on the surface, is produced.

Figure 2C:
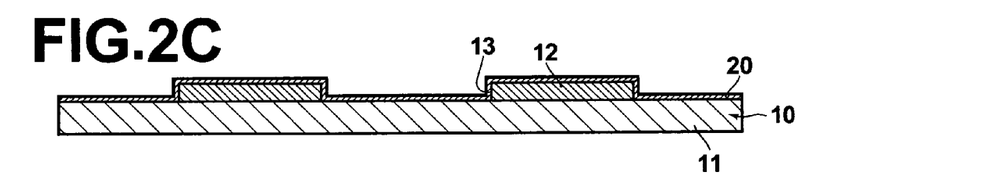

Thereafter, as illustrated in FIG. 2C, the bottom electrode 20 is formed on approximately the entire area of the surface of the surface recess-protrusion base plate 10 and along the surface shape of the surface recess-protrusion base plate 10. In this embodiment, it is necessary for the difference in surface height between each of the recess areas 13, 13, . . . and each of the protruding areas 12, 12, . . . of the surface recess-protrusion base plate 10, the thickness of the bottom electrode 20, and the like, to be designed such that the surface recess-protrusion pattern may not be lost due to the formation of the bottom electrode 20.

(Step (B))

Figure 2D:
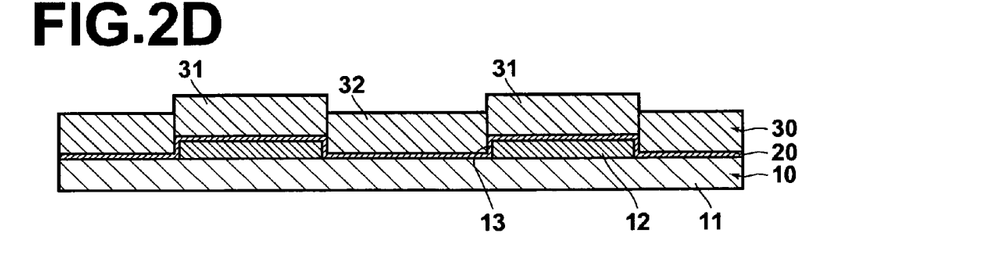

Thereafter, as illustrated in FIG. 2D, a film of the material for the formation of the piezoelectric film 30 is formed on approximately the entire area of the surface of the surface recess-protrusion base plate 10 and along the surface shape of the surface recess-protrusion base plate 10. In this manner, the piezoelectric film (acting as the inorganic film) 30 is formed. The piezoelectric film 30 contains the plurality of the pillar-shaped structure bodies, each of which extends in a direction nonparallel with the base plate surface of the surface recess-protrusion base plate 10. In cases where each of the pillar-shaped structure bodies is grown in the direction approximately normal to the base plate surface of the surface recess-protrusion base plate 10, an inorganic film having the orientational characteristics approximately in the (100) direction is obtained.

As described above, the thickness of the piezoelectric film 30 may ordinarily be at least 1 μm and may fall within the range of, for example, 1 μm to 5 μm. Also, the mean pillar diameter of the plurality of the pillar-shaped structure bodies contained in the piezoelectric film 30 may fall within the range of, for example, 30 nm to 1 μm. The piezoelectric film 30 may be formed with one of a wide variety of film forming techniques. For example, it is possible to employ a vapor phase growing technique, such as a chemical vapor deposition (CVD) technique or a sputtering technique. In cases where the conditions, such as the film formation temperature and the pressure, are adjusted in accordance with the kind of the material, the pillar-shaped structure bodies having the desired mean pillar diameter are capable of being caused to grow in a desired direction.

The film formation temperature is set at a temperature, at which the inorganic film containing the plurality of the pillar-shaped structure bodies is capable of being formed reliably. In cases where PZT is employed as the material of the piezoelectric film 30, the film formation temperature should preferably fall within the range of 500° C. to 600° C.

The pillar-shaped structure bodies, which are adjacent to each other, are apt to be mechanically separated easily from each other. Therefore, in cases where the piezoelectric film 30 having the structure described above is merely formed along the surface shape of the surface recess-protrusion base plate 10, each of the on-protrusion film regions 31, 31, . . . of the piezoelectric film 30, each of which regions is located on one of the protruding areas 12, 12, . . . of the surface recess-protrusion base plate 10, and the adjacent one of the on-recess film regions 32, 32, . . . of the piezoelectric film 30, each of which regions is located on one of the recess areas 13, 13, . . . of the surface recess-protrusion base plate 10, are capable of being mechanically separated from each other.

With this embodiment, each of the on-protrusion film regions 31, 31, . . . of the piezoelectric film 30 and the adjacent one of the on-recess film regions 32, 32, . . . of the piezoelectric film 30 are capable of being separated appropriately from each other at the inter face between the pillar-shaped structure bodies. Therefore, the surface direction of the boundary surface between each of the on-protrusion film regions 31, 31, . . . of the piezoelectric film 30 and the adjacent one of the on-recess film regions 32, 32, . . . of the piezoelectric film 30 is capable of approximately coinciding with the direction of orientation of the pillar-shaped structure body, which is located at the boundary part between the on-protrusion film region 31 and the adjacent on-recess film region 32. Accordingly, a variation of the angle of the boundary surface between the on-protrusion film region 31 of the piezoelectric film 30 and the adjacent on-recess film region 32 of the piezoelectric film 30 is capable of being suppressed markedly. Also, the smoothness of the boundary surface between the on-protrusion film region 31 of the piezoelectric film 30 and the adjacent on-recess film region 32 of the piezoelectric film 30 is capable of being kept good.

In this embodiment, the angle of the direction of orientation of each of the pillar-shaped structure bodies, which angle is made with respect to the base plate surface of the surface recess-protrusion base plate 10, should preferably be set so as to fall within the range of 90±30°, and should particularly preferably be set so as to fall within the range of 90±10°. (The reference surface for the angle of the direction of orientation of each of the pillar-shaped structure bodies and the "+" direction, in which the angle of the direction of orientation of each of the pillar-shaped structure bodies is taken, are set to be identical with the reference surface and the "+" direction for the angle θ1 of the side face of each of the protruding areas 12, 12, . . . of the surface recess-protrusion base plate 10 and the angle θ2 of the boundary surface between each of the on-protrusion film regions 31, 31, ... of the piezoelectric film 30 and the adjacent one of the on-recess film regions 32, 32, ... of the piezoelectric film 30.) Also, the angle θ1 of the side face of each of the protruding areas 12, 12, ... of the surface recess-protrusion base plate 10 may be kept approximately at a predetermined value. In such cases, the angle of the boundary surface between each of the on-protrusion film regions 31, 31, ... of the piezoelectric film 30 and the adjacent one of the on-recess film regions 32, 32, ... of the piezoelectric film 30, which angle is made with respect to the base plate surface of the surface recess-protrusion base plate 10, is capable of being reliably set at a desired angle. Specifically, the angle θ1 of the side face of each of the protruding areas 12, 12, ... of the surface recess-protrusion base plate 10 may be set to be approximately normal to the base plate surface of the surface recess-protrusion base plate 10, and the pillar-shaped structure bodies may thus be orientated in the direction approximately normal to the base plate surface of the surface recess-protrusion base plate 10. In such cases, the end face shape of each of the on-protrusion film regions 31, 31, ... of the piezoelectric film 30, which regions act as the piezoelectric regions, is capable of being reliably set at the shape approximately normal to the base plate surface of the surface recess-protrusion base plate 10.

(Step (C))

It may often occur that, merely with the formation of the piezoelectric film 30 on the surface recess-protrusion base plate 10, each of the on-protrusion film regions 31, 31, ... of the piezoelectric film 30 and the adjacent one of the on-recess film regions 32, 32, ... of the piezoelectric film 30 are not mechanically separated from each other. In such cases, the step (C) is performed for applying force of physical action to the piezoelectric film 30 and thereby mechanically separating each of the on-protrusion film regions 31, 31, ... of the piezoelectric film 30 and the adjacent one of the on-recess film regions 32, 32, ... of the piezoelectric film 30 from each other. The step (C) may be performed before a step (D), which will be described later, is performed. Alternatively, the step (C) may be performed after the step (D) has been performed.

In this embodiment, after the piezoelectric device 1 has been produced (i.e., after the step (D) has been performed), an electric field is applied across each of the on-protrusion film regions 31, 31, ... of the piezoelectric film 30, and each of the on-protrusion film regions 31, 31, ... is thus caused to undergo expansion and contraction. In this manner, each of the on-protrusion film regions 31, 31, ... of the piezoelectric film 30 and the adjacent one of the on-recess film regions 32, 32, ... of the piezoelectric film 30 are capable of being mechanically separated easily from each other.

Besides the application of the electric field, the application of heat, vibrations, or an ultrasonic wave may be performed on the surface recess-protrusion base plate 10 and/or the piezoelectric film 30, and each of the on-protrusion film regions 31, 31, ... of the piezoelectric film 30 and the adjacent one of the on-recess film regions 32, 32, ... of the piezoelectric film 30 are thus capable of being mechanically separated easily from each other.

(Step (D))

Figure 2E:
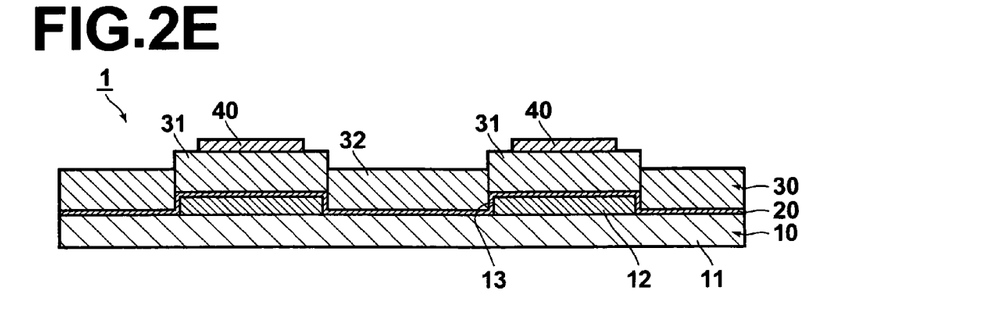

In the step (D), each of the top electrodes 40, 40, ... is formed on one of the on-protrusion film regions 31, 31, ... of the piezoelectric film 30. When necessary, the bottom surface of the surface recess-protrusion base plate 10 may be subjected to etching processing, and the thickness of the surface recess-protrusion base plate 10 may thus be set to be thin. At this stage, the production of the piezoelectric device 1 is completed.

Thereafter, the vibrating plate 50 and the ink storing and discharging member 60 are fitted to the piezoelectric device 1. (The steps of fitting the vibrating plate 50 and the ink storing and discharging member 60 to the piezoelectric device 1 are not shown.) In this manner, the ink jet type recording head 2 is produced.

This embodiment of the piezoelectric device (acting as the inorganic film base plate) 1 is produced with the process comprising the steps of: (i) preparing the surface recess-protrusion base plate 10, which is provided with the recess-protrusion pattern on the surface, and (ii) forming the piezoelectric film (acting as the inorganic film) 30 along the surface shape of the surface recess-protrusion base plate 10, the piezoelectric film 30 containing the plurality of the pillar-shaped structure bodies, each of which extends in the direction nonparallel with the base plate surface of the surface recess-protrusion base plate 10.

The pillar-shaped structure bodies, which are adjacent to each other, are apt to be mechanically separated easily from each other. Therefore, with this embodiment, the piezoelectric film 30 having the structure, such that each of the on-protrusion film regions 31, 31, ... of the piezoelectric film 30, each of which regions is located on one of the protruding areas 12, 12, ... of the surface recess-protrusion base plate 10, and the adjacent one of the on-recess film regions 32, 32, ... of the piezoelectric film 30, each of which regions is located on one of the recess areas 13, 13, ... of the surface recess-protrusion base plate 10, are mechanically separated from each other, is capable of being obtained at a high accuracy, with the simple process free from an etching step, and at a low cost regardless of the material and the thickness of the inorganic film.

As described above, with this embodiment, each of the on-protrusion film regions 31, 31, ... of the piezoelectric film 30 and the adjacent one of the on-recess film regions 32, 32, ... of the piezoelectric film 30 are capable of being separated appropriately from each other at the interface between the pillar-shaped structure bodies. Therefore, the shape accuracy of the boundary surface between each of the on-protrusion film regions 31, 31, ... of the piezoelectric film 30 and the adjacent one of the on-recess film regions 32, 32, ... of the piezoelectric film 30 is capable of kept good. Also, the smoothness of the boundary surface between the on-protrusion film region 31 of the piezoelectric film 30 and the adjacent on-recess film region 32 of the piezoelectric film 30 is capable of being kept good.

Further, with this embodiment, the angle θ1 of the side face of each of the protruding areas 12, 12, ... of the surface recess-protrusion base plate 10 may be set to be approximately normal to the base plate surface of the surface recess-protrusion base plate 10, and the pillar-shaped structure bodies may thus be orientated in the direction approximately normal to the base plate surface of the surface recess-protrusion base plate 10. In such cases, the angle of the boundary surface between each of the on-protrusion film regions 31, 31, ... of the piezoelectric film 30 and the adjacent one of the on-recess film regions 32, 32, ... of the piezoelectric film 30, which angle is made with respect to the base plate surface of the surface recess-protrusion base plate 10, is capable of being reliably set to be approximately normal to the base plate surface of the surface recess-protrusion base plate 10.

As described above, with this embodiment, the piezoelectric film 30 containing the plurality of the mechanically separated regions is capable of being formed accurately and with the simple process, regardless of the material and the thickness of the piezoelectric film 30. Also, the shape accuracy of each of the mechanically separated regions is capable of being kept high.

Figure 3A:
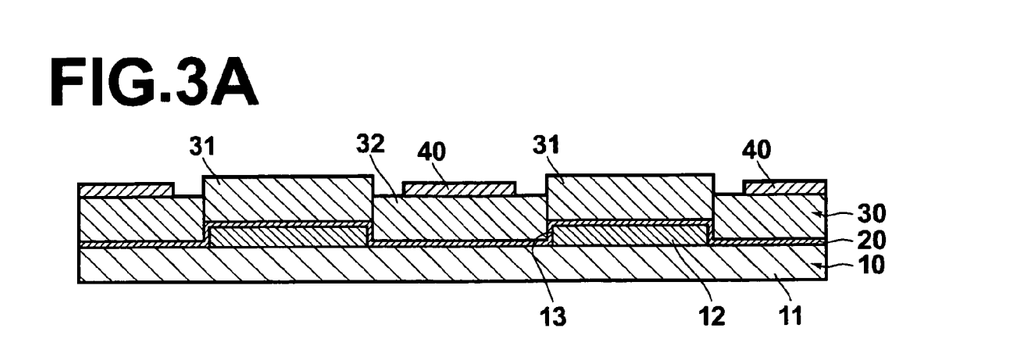
FIG. 3A is a sectional view showing an example of design modification of the piezoelectric device of FIG. 1.
Figure 3B:
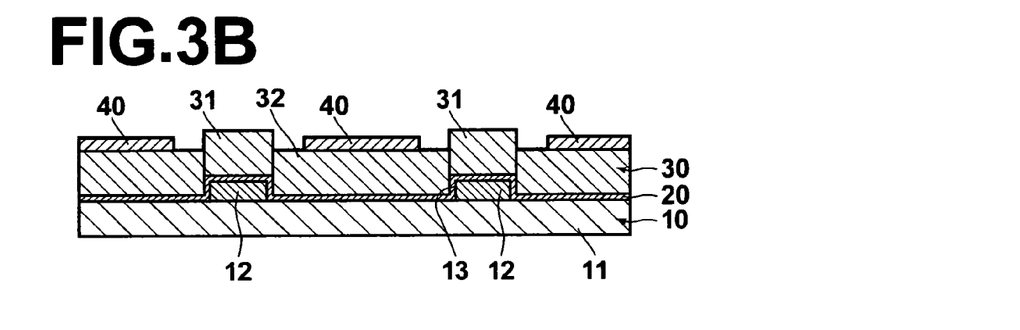
FIG. 3B is a sectional view showing a different example of design modification of the piezoelectric device of FIG. 1.

In the embodiment described above, only each of the on-protrusion film regions 31, 31, . . . of the piezoelectric film 30 acts as the piezoelectric region, which undergoes expansion and contraction in accordance with an alteration of the applied electric field. However, each of the on-protrusion film regions 31, 31, . . . of the piezoelectric film 30 and each of the on-recess film regions 32, 32, . . . of the piezoelectric film 30 are capable of being caused to undergo the independent expansion and contraction. Therefore, the top electrode 40 may be formed on each of the on-protrusion film regions 31, 31, . . . and/or each of the on-recess film regions 32, 32, . . . , and each of the on-protrusion film regions 31, 31, . . . and/or each of the on-recess film regions 32, 32, . . . may thus be constituted as the piezoelectric region. FIG. 3A shows a modification of the piezoelectric device, in which each of the on-recess film regions 32, 32, . . . is constituted as the piezoelectric region. FIG. 3B shows a different modification of the piezoelectric device, in which the width of each of protruding areas 12', 12', . . . of a surface recess-protrusion base plate 10' is set to be smaller than the width of each of the protruding areas 12, 12, . . . of the surface recess-protrusion base plate 10 illustrated in FIG. 3A, and a bottom electrode 20' and a piezoelectric film 30' have the shapes corresponding to the width of each of the protruding areas 12', 12', of the surface recess-protrusion base plate 10'.

[Ink Jet Type Recording System]

Figure 4:
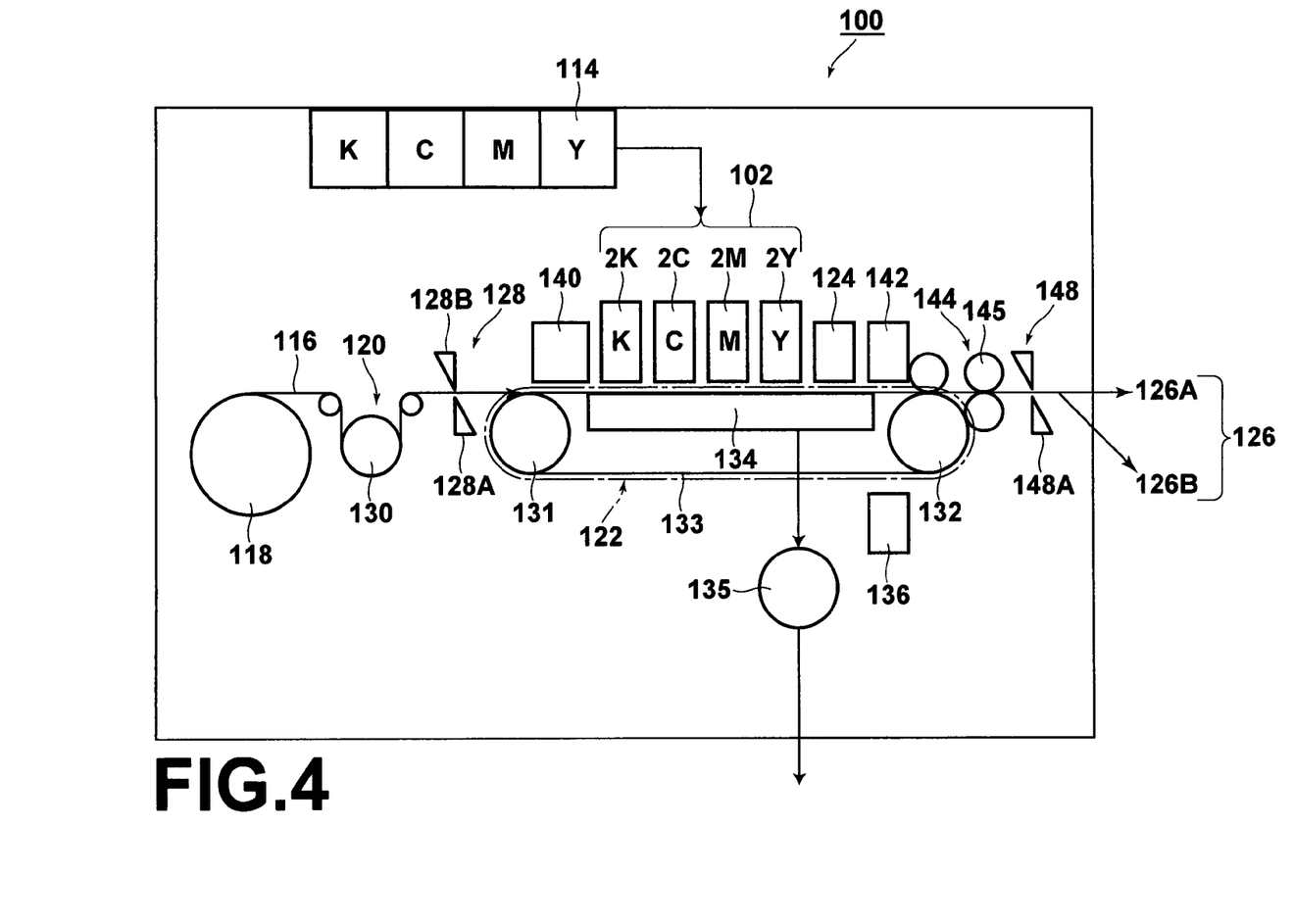
FIG. 4 is a schematic view showing an example of an ink jet type recording system, in which the ink jet type recording head of FIG. 1 is employed.
Figure 5:
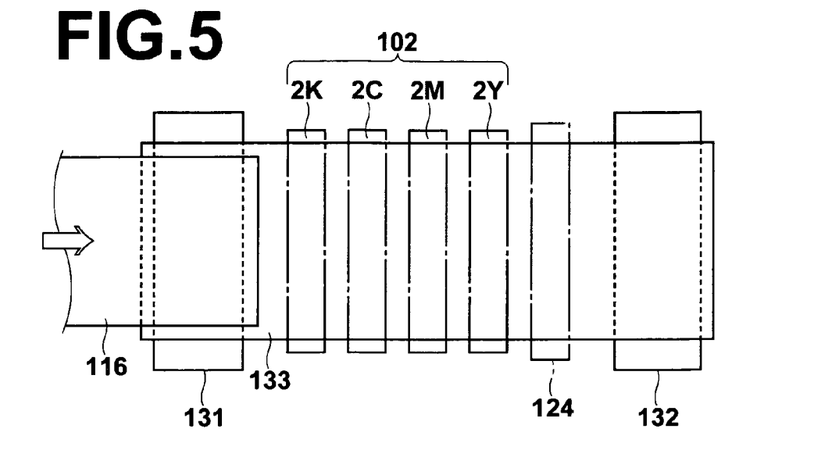
FIG. 5 is a plan view showing a part of the ink jet type recording system of FIG. 4.

An example of an ink jet type recording system, in which the ink jet type recording head 2 of FIG. 1 is employed, will be described hereinbelow with reference to FIG. 4 and FIG. 5. FIG. 4 is a schematic view showing an example of an ink jet type recording system, in which the ink jet type recording head of FIG. 1 is employed. FIG. 5 is a plan view showing a part of the ink jet type recording system of FIG. 4.

With reference to FIG. 4 and FIG. 5, an ink jet type recording system 100 comprises a printing section 102, which is provided with a plurality of ink jet type recording heads (hereinbelow referred to simply as the heads) 2K, 2C, 2M, and 2Y. Each of the heads 2K, 2C, 2M, and 2Y is utilized for one of different ink colors. The ink jet type recording system 100 also comprises an ink stocking and loading section 114 for storing ink compositions, each of which is to be furnished to one of the heads 2K, 2C, 2M, and 2Y. The ink jet type recording system 100 further comprises a paper supply section 118 for supplying recording paper 116. The ink jet type recording system 100 still further comprises a de-curling processing section 120 for eliminating roll set curl of the recording paper 116 having been received from the paper supply section 118. The ink jet type recording system 100 also comprises a suction belt conveyor section 122, which is located so as to stand facing a nozzle bottom surface (i.e., an ink discharge surface) of the printing section 102. The suction belt conveyor section 122 conveys the recording paper 116, while flatness of the recording paper 116 is being kept. The ink jet type recording system 100 further comprises a print detecting section 124 for reading out the results of the printing performed with the printing section 102. The ink jet type recording system 100 still further comprises a paper discharge section 126 for discharging the printed recording paper (i.e., the printed paper) to the exterior of the ink jet type recording system 100.

Each of the heads 2K, 2C, 2M, and 2Y of the printing section 102 is constituted of the ink jet type recording head 2 illustrated in FIG. 1.

In the de-curling processing section 120, heat is given by a heating drum 130 to the recording paper 116 in the direction reverse to the direction of the roll set curl, and the de-curling processing is thereby performed.

As illustrated in FIG. 4, in the cases of the ink jet type recording system 100 utilizing the rolled paper, a cutter 128 is located at the stage after the de-curling processing section 120, and the rolled paper is cut by the cutter 128 into a desired size. The cutter 128 is constituted of a stationary blade 128A, which has a length equal to at least the width of the conveyance path for the recording paper 116, and a round blade 128B, which is capable of being moved along the stationary blade 128A. The stationary blade 128A is located on the side of the rear surface of the recording paper 116, which rear surface is opposite to the printing surface of the recording paper 116. Also, the round blade 128B is located on the side of the printing surface of the recording paper 116 with the conveyance path intervening between the stationary blade 128A and the round blade 128B. In the cases of a system utilizing cut paper sheets, the system need not be provided with the cutter 128.

The recording paper 116, which has been subjected to the de-curling processing and has then been cut into the desired size, is sent into the suction belt conveyor section 122. The suction belt conveyor section 122 has the structure, in which an endless belt 133 is threaded over two rollers 131 and 132. The suction belt conveyor section 122 is constituted such that at least a part of the suction belt conveyor section 122, which part stands facing the nozzle bottom surface of the printing section 102 and a sensor surface of the print detecting section 124, may constitute a horizontal surface (a flat surface).

The belt 133 has a width larger than the width of the recording paper 116. The belt 133 has a plurality of suction holes (not shown), which are open at the belt surface. Also, a suction chamber 134 is located within the space defined by the belt 133, which is threaded over the two rollers 131 and 132. Specifically, the suction chamber 134 is located at the position that stands facing the nozzle bottom surface of the printing section 102 and the sensor surface of the print detecting section 124. The region within the suction chamber 134 is evacuated into a negative pressure by use of a fan 135, and the recording paper 116 located on the belt 133 is thereby supported by suction on the belt 133.

Rotation power of a motor (not shown) is transferred to at least either one of the rollers 131 and 132, over which the belt 133 is threaded. The belt 133 is thus rotated clockwise in FIG. 4, and the recording paper 116 having been supported on the belt 133 is thereby conveyed toward the right in FIG. 4.

In the cases of brimless printing, or the like, it will occur that the ink composition clings to the belt 133 beyond the area of the recording paper 116. Therefore, a belt cleaning section 136 is located at a predetermined position on the side outward from the space defined by the belt 133 (specifically, at an appropriate position other than the printing region).

A heating fan 140 is located on the side upstream from the printing section 102 with respect to the paper conveyance path, which is formed by the suction belt conveyor section 122. The heating fan 140 blows dry air against the recording paper 116 before being subjected to the printing and thereby heats the recording paper 116. In cases where the recording paper 116 is thus heated just before the recording paper is subjected to the printing, the ink composition having been jetted out onto the recording paper 116 is capable of drying easily.

As illustrated in FIG. 5, the printing section 102 is constituted of the full-line type heads. Specifically, in the printing section 102, the line type heads having a length corresponding to a maximum paper width are located so as to extend in the direction (i.e., the main scanning direction), which is normal to the paper feed direction. Each of the heads 2K, 2C, 2M, and 2Y is constituted of the line type head provided with a plurality of ink discharge openings (of the nozzles), which are arrayed over a length at least longer than one side of the recording paper 116 of the maximum size to be processed by the ink jet type recording system 100.

The heads 2K, 2C, 2M, and 2Y corresponding to the ink colors are located in the order of black (K), cyan (C), magenta (M), and yellow (Y) from the upstream side with respect to the feed direction of the recording paper 116. The color ink compositions are discharged respectively from the heads 2K, 2C, 2M, and 2Y, while the recording paper 116 is being conveyed. A color image is thus recorded on the recording paper 116.

The print detecting section 124 may be constituted of, for example, a line sensor for imaging the results of the droplet jetting-out operation performed by the printing section 102. The print detecting section 124 thus detects discharge failures, such as nozzle clogging, in accordance with the droplet jetting-out image having been read out by the line sensor.

A post-drying section 142 is located at the stage after the print detecting section 124. The post-drying section 142 may be constituted of, for example, a heating fan for drying the printed image surface. At the stage before the ink composition having been jetted out onto the recording paper 116 dries, the printing surface should preferably be free from contact with a drying member, or the like. Therefore, the post-drying section 142 should preferably employ a drying technique for blowing hot air against the printing surface.

In order to control surface gloss of the image surface, a heating and pressure applying section 144 is located at the stage after the post-drying section 142. In the heating and pressure applying section 144, a pressure is applied to the image surface by a press roller 145 having a predetermined surface recess-protrusion pattern, while the image surface is being heated. The recess-protrusion pattern is thus transferred from the press roller 145 to the image surface.

The printed paper having thus been obtained is then discharged through the paper discharge section 126. Ordinarily, the printed paper, on which a regular image (an object image) to be recorded has been printed, and the printed paper, on which a test printing image has been printed, should preferably be discharged to different destinations. The ink jet type recording system 100 is provided with sorting means (not shown) for sorting out the printed paper, on which the regular image to be recorded has been printed, and the printed paper, on which the test printing image has been printed, and changing over the paper discharge paths to each other in order to send the printed paper, on which the regular image to be recorded has been printed, and the printed paper, on which the test printing image has been printed, in to a discharge section 126A and a discharge section 126B, respectively.

In cases where both the regular image to be recorded and the test printing image are printed in parallel on a single large-sized paper sheet at the printing section 102, a cutter 148 may be located in order to separate the paper sheet region, on which the test printing image has been printed, from the paper sheet region, on which the regular image to be recorded has been printed.

The ink jet type recording system 100 is constituted in the manner described above.

(Design Modifications)

The inorganic film base plate, the process for producing an inorganic film base plate, the piezoelectric device, the ink jet type recording head, and the ink jet type recording apparatus in accordance with the present invention are not limited to the embodiments described above and may be embodied in various other ways.

For example, the surface recess-protrusion pattern of the surface recess-protrusion base plate 10 is not limited to the recess-protrusion pattern employed in the embodiments described above and may be designed in various other ways. Also, the surface recess-protrusion base plate is not limited to the structure, in which the protruding areas 12, 12, . . . are formed on the flat base plate 11, and one of various other surface recess-protrusion base plates, which are provided with the surface recess-protrusion patterns, may be employed. For example, it is possible to employ a surface recess-protrusion base plate obtained from processing, in which recess areas are formed in a predetermined pattern on the surface of a flat base plate with an etching technique. It is also possible to employ a surface recess-protrusion base plate obtained with an integral molding technique.

Further, in the embodiments described above, the surface recess-protrusion base plate 10 and the vibrating plate 50 are constituted as different members. Alternatively, in lieu of the vibrating plate 50 being utilized, the surface recess-protrusion base plate 10 may be constituted so as to have the function of the vibrating plate.

Furthermore, in the embodiments described above, the inorganic film base plate in accordance with the present invention is constituted as the piezoelectric device. However, the inorganic film base plate in accordance with the present invention may be provided with an inorganic film constituted of an arbitrary material, which enables the pillar-shaped structure bodies to grow. The inorganic film base plate in accordance with the present invention is particularly appropriately applicable to an inorganic film base plate provided with a piezoelectric film, or the like, which is constituted of a material hard to etch and is formed to be thicker than the electrodes, and the like, having a thickness on the order of nanometers.

Examples of the materials for the inorganic films, which materials enable the pillar-shaped structure bodies to grow and are other than the piezoelectric material, include oxides, such as $ZrO_2$, $ZnO$, $Al_2O_3$, and $TiO_2$; nitrides, such as AlN, $Si_3N_4$, and TiN; carbides, such as SiC, and $B_4C$; metals, such as Al, Cu, Ta, and Ti; and combinations of the above-enumerated materials.

EXAMPLES

The present invention will further be illustrated by the following nonlimitative examples.

Example 1

A piezoelectric device in accordance with the present invention and an ink jet type recording head in accordance with the present invention were produced with the process illustrated in FIGS. 2A to 2E.

Specifically, an SOI base plate 14, which was composed of a silicon base plate 11 and an $SiO_2$ oxide film 12X having been formed on the surface of the silicon base plate 11, was prepared. Also, the SOI base plate 14 was subjected to wet etching processing using buffered hydrogen fluoride (BHF). With the wet etching processing, unnecessary areas of the $SiO_2$ oxide film 12X (i.e., the areas for forming the recess areas 13, 13, . . . ) were removed, and the protruding areas 12, 12, . . . , each of which had a thickness of 0.5 μm and had a 500

μm square shape, were formed in a predetermined pattern. In this manner, the surface recess-protrusion base plate 10 was produced.

Thereafter, by use of a sputtering technique, a Pt bottom electrode 20 having a thickness of 200 nm was formed over approximately the entire area of the surface of the surface recess-protrusion base plate 10 and along the surface shape of the surface recess-protrusion base plate 10. After the Pt bottom electrode 20 had thus been formed, the surface recess-protrusion shape of the surface recess-protrusion base plate 10 was kept approximately at the original recess-protrusion shape.

Thereafter, by use of the sputtering technique, a PZT film 30 having the crystal orientational characteristics was formed to a thickness of 5 μm over approximately the entire area of the surface of the surface recess-protrusion base plate 10 and along the surface shape of the surface recess-protrusion base plate 10. At this time, as the film forming conditions, the base plate temperature was set to 550° C.

FIG. 6 shows an SEM sectional photograph of the PZT film 30 having thus been formed along the surface shape of the surface recess-protrusion base plate 10.

As illustrated in FIG. 6, the side face of each of the protruding areas 12, 12, . . . of the surface recess-protrusion base plate 10 was the regular taper slant face (as indicated by "taper face" in FIG. 6). The angle θ1 of the side face of each of the protruding areas 12, 12, . . . of the surface recess-protrusion base plate 10, which angle was made with respect to the base plate surface of the surface recess-protrusion base plate 10, was equal to approximately 80°.

It was confirmed that the PZT film 30 was constituted of a crystalline inorganic film, which had the orientational characteristics approximately in the (100) direction and contained a plurality of pillar-shaped structure bodies (having a mean pillar diameter of 150 nm) having been grown in the direction approximately normal to the base plate surface of the surface recess-protrusion base plate 10. Also, it was confirmed that the PZT film 30 had a film structure, in which the direction of the growth of the pillar-shaped structure body varied for the region on the flat surface of the surface recess-protrusion base plate 10 and the region on the slant side face of each of the protruding areas 12, 12, . . . of the surface recess-protrusion base plate 10. Specifically, in each of the region on the flat surface of each of the protruding areas 12, 12, . . . of the surface recess-protrusion base plate 10 and the region on the flat surface of each of the recess areas 13, 13, . . . of the surface recess-protrusion base plate 10, the pillar-shaped structure body had been grown in the direction approximately normal to the base plate surface of the surface recess-protrusion base plate 10. Also, in the region on the side face of each of the protruding areas 12, 12, . . . of the surface recess-protrusion base plate 10, the pillar-shaped structure body had been grown in the direction oblique with respect to the base plate surface of the surface recess-protrusion base plate 10. Further, a fine crack was found between each of the on-protrusion film regions 31, 31, . . . of the PZT film 30, each of which regions was located on one of the protruding areas 12, 12, . . . of the surface recess-protrusion base plate 10, and the adjacent one of the on-recess film regions 32, 32, . . . of the PZT film 30, each of which regions was located on one of the recess areas 13, 13, . . . of the surface recess-protrusion base plate 10. It was thus found that each of the on-protrusion film regions 31, 31, . . . of the PZT film 30 and the adjacent one of the on-recess film regions 32, 32, . . . of the PZT film 30 were separated appropriately from each other at the interface between the pillar-shaped structure bodies.

The angle θ2 of the boundary surface between each of the on-protrusion film regions 31, 31, . . . of the PZT film 30 and the adjacent one of the on-recess film regions 32, 32, . . . of the PZT film 30, which angle was made with respect to the base plate surface of the surface recess-protrusion base plate 10, was equal to approximately 110°.

After the PZT film 30 had been formed in the manner described above, by use of the sputtering technique, a Pt top electrode 40 was formed to a thickness of 100 nm on each of the on-protrusion film regions 31, 31, . . . of the PZT film 30. Finally, etching processing was performed on the bottom surface of the surface recess-protrusion base plate 10, and the thickness of the surface recess-protrusion base plate 10 was thus set at 15 μm. In this manner, the piezoelectric device 1 in accordance with the present invention was obtained.

Thereafter, the ink storing and discharging member 60, which was provided with the ink chambers 61, 61, . . . and the ink discharge openings 62, 62, . . . , was secured to the bottom surface of the surface recess-protrusion base plate 10 of the aforesaid piezoelectric device 1. In this manner, the ink jet type recording head 2 (chamber size: 800 μm square) in accordance with the present invention was obtained. With the thus obtained ink jet type recording head 2, the surface recess-protrusion base plate 10 acted also as the vibrating plate.

An electric field was applied across the PZT film 30 of the ink jet type recording head 2, and a strain displacement quantity of the PZT film 30 was measured. At this time, the applied voltage was set at 5V.

With respect to the cases, wherein the PZT film 30 was constituted of the separated type film, in which each of the on-protrusion film regions 31, 31, . . . of the PZT film 30 and the adjacent one of the on-recess film regions 32, 32, . . . had been mechanically separated from each other, and the cases, wherein the PZT film 30 was constituted of an integral type film, in which each of the on-protrusion film regions 31, 31, . . . of the PZT film 30 and the adjacent one of the on-recess film regions 32, 32, . . . had not been mechanically separated from each other, simulations with general-purpose finite element method software (ANSYS) were made, and the strain displacement quantities were calculated.

The results shown in Table 1 below were obtained. As shown in Table 1, the strain displacement quantity of the PZT film 30, which strain displacement quantity was measured with the electric field application as described above, approximately coincided with the result of the simulation, which was made with respect to the cases, wherein each of the on-protrusion film regions 31, 31, . . . of the PZT film 30 and the adjacent one of the on-recess film regions 32, 32, . . . had been mechanically separated from each other. The obtained result represented that the PZT film 30 having been formed in Example 1 was constituted of the plurality of the film regions having been mechanically separated from one another.

The inventors confirmed that the strain displacement quantity of the PZT film 30 having been obtained in Example 1 approximately coincided with the strain displacement quantity of a PZT film having been obtained with processing, wherein the PZT film was formed in a predetermined pattern on a flat silicon base plate by use of the dry etching technique in accordance with the conventional process for producing a piezoelectric device, and wherein the other conditions were set to be identical with the conditions employed in Example 1.

Also, the inventors confirmed that, in cases where a piezoelectric device 1 was produced with processing, in which the top electrode 40 was formed on each of the on-recess film regions 32, 32, . . . of the PZT film 30, in lieu of being formed on each of the on-protrusion film regions 31, 31, . . . of the PZT film 30, the same results as those in Example 1 were capable of being obtained.

TABLE 1

|  | Results of simulations | | |
|---|---|---|---|
|  | Measured value (nm) | Integral type film (nm) | Separated type film (nm) |
| Strain displacement quantity | 125 | 40 | 130 |

Comparative Example 1

A piezoelectric device for comparison was produced in the same manner as that in Example 1, except that a PZT film was formed with a sol-gel technique. The obtained PZT film was subjected to SEM observation, and it was found that the PZT film had a film structure, which did not contain pillar-shaped structure bodies. With respect to the obtained piezoelectric device, the measurement of the strain displacement quantity was made in the same manner as that in Example 1. It was found that the strain displacement quantity of the obtained piezoelectric device was 30 nm. The strain displacement quantity of the obtained piezoelectric device approximately coincided with the result of the simulation having been made with respect to the integral type film, in which each of the on-protrusion film regions of the PZT film and the adjacent one of the on-recess film regions had not been mechanically separated from each other.

From the results described above, it was found that, with the film structure, which did not contain pillar-shaped structure bodies, even though the PZT film was formed on the surface recess-protrusion base plate and along the surface shape of the surface recess-protrusion base plate, the PZT film was not capable of being set at the mechanically separated structure.

Further, the inventors confirmed that, in cases where a PZT film was formed by use of an aerosol deposition (AD) technique, the obtained PZT film had a film structure, which did not contain pillar-shaped structure bodies, and the same result as that in Comparative Example 1 was obtained.

INDUSTRIAL APPLICABILITY

The present invention is applicable to an inorganic film base plate provided with an inorganic film constituted of a plurality of film regions having been mechanically separated from one another. The present invention is capable of being appropriately applied to piezoelectric devices, and the like, for use in ink jet type recording apparatuses, and the like.

What is claimed is:
1. An inorganic film base plate comprising:
a surface recess-protrusion base plate, which is provided with a recess-protrusion pattern on a surface, and
an inorganic film formed along the surface of the surface recess-protrusion base plate, the inorganic film containing a plurality of pillar-shaped structure bodies, each of which extends in a direction nonparallel with the base plate surface of the surface recess-protrusion base plate, wherein the diameter of each of the plurality of pillar-shaped structure bodies is less than the width of a recess of the recess-protrusion pattern, and less than the width of a protrusion of the recess-protrusion pattern,
wherein the inorganic film has a structure such that an on-protrusion film region of the inorganic film, which on-protrusion film region is located on each of protruding areas constituting the recess-protrusion pattern of the surface recess-protrusion base plate, and an adjacent on-recess film region of the inorganic film, which on-recess film region is located on each of recess areas constituting the recess-protrusion pattern of the surface recess-protrusion base plate, are mechanically separated from each other.

2. An inorganic film base plate, as defined in claim 1, wherein the inorganic film is produced by mechanically separating the on-protrusion film region and the on-recess film region from each other by exerting force of physical action upon the inorganic film after the inorganic film is deposited.

3. An inorganic film base plate as defined in claim 1, wherein the inorganic film has a structure, such that the on-protrusion film region of the inorganic film and the adjacent on-recess film region of the inorganic film are separated from each other at an interface between the pillar-shaped structure bodies.

4. An inorganic film base plate as defined in claim 1, wherein a boundary surface between the on-protrusion film region of the inorganic film and the adjacent on-recess film region of the inorganic film makes an angle falling within the range of 90±45° with respect to the base plate surface of the surface recess-protrusion base plate.

5. An inorganic film base plate as defined in claim 1 wherein a difference in surface height between each of recess areas of the recess-protrusion pattern of the surface recess-protrusion base plate and each of protruding areas of the recess-protrusion pattern is equal to at least 1/30 of a thickness of the inorganic film.

6. An inorganic film base plate as defined in claim 1 wherein a difference in surface height between each of recess areas of the recess-protrusion pattern of the surface recess-protrusion base plate and each of protruding areas of the recess-protrusion pattern falls within the range of 0.1 µm to 2 µm.

7. An inorganic film base plate as defined in claim 1 wherein a side face of each of protruding areas constituting the recess-protrusion pattern of the surface recess-protrusion base plate makes an angle falling within the range of 5° to 135° with respect to the base plate surface of the surface recess-protrusion base plate.

8. An inorganic film base plate as defined in claim 1 wherein a mean pillar diameter of the plurality of the pillar-shaped structure bodies constituting the inorganic film falls within the range of 30 nm to 1 µm.

9. An inorganic film base plate as defined in claim 1 wherein the inorganic film is constituted of a piezoelectric material.

10. A piezoelectric device, which is provided with an inorganic film base plate as defined in claim 9, the piezoelectric device comprising:
i) the surface recess-protrusion base plate,
ii) the inorganic film, which, is constituted of a piezoelectric material, and which is formed on the surface recess-protrusion base plate, and
iii) electrodes, which are formed on the surface recess-protrusion base plate, the electrodes applying an electric field across an on-protrusion film region of the inorganic film, which on-protrusion film region is located on each of protruding areas constituting the recess-protrusion pattern of the surface recess-protrusion base plate, and/or across an on-recess film region of the inorganic film, which on-recess film region is located on each recess areas constituting the recess-protrusion pattern of the surface recess-protrusion base plate.

11. An ink jet type recording head, comprising a piezoelectric device as defined in claim 10.

12. An ink jet type recording apparatus, comprising a piezoelectric device as defined in claim 10.

13. An inorganic film base plate, as defined in claim 1, wherein the inorganic film is a pillar-shaped structure film of Thornton zone model.

* * * * *